(12) United States Patent
Nomura

(10) Patent No.: US 10,820,416 B2
(45) Date of Patent: Oct. 27, 2020

(54) SUBSTRATE APPARATUS AND METHOD OF MANUFACTURING THE SAME

(71) Applicant: SONY CORPORATION, Tokyo (JP)

(72) Inventor: Yoshiyuki Nomura, Gifu (JP)

(73) Assignee: SONY CORPORATION, Tokyo (JP)

( * ) Notice: Subject to any disclaimer, the term of this patent is extended or adjusted under 35 U.S.C. 154(b) by 83 days.

(21) Appl. No.: 15/774,074

(22) PCT Filed: Nov. 11, 2016

(86) PCT No.: PCT/JP2016/083476
§ 371 (c)(1),
(2) Date: May 7, 2018

(87) PCT Pub. No.: WO2017/090460
PCT Pub. Date: Jun. 1, 2017

(65) Prior Publication Data
US 2018/0324950 A1 Nov. 8, 2018

(30) Foreign Application Priority Data
Nov. 27, 2015 (JP) .................... 2015-231326

(51) Int. Cl.
*H05K 1/00* (2006.01)
*H05K 1/14* (2006.01)
(Continued)

(52) U.S. Cl.
CPC ............ *H05K 1/145* (2013.01); *H05K 1/11* (2013.01); *H05K 1/14* (2013.01); *H05K 1/181* (2013.01);
(Continued)

(58) Field of Classification Search
CPC . H05K 1/145; H05K 1/11; H05K 1/14; H05K 1/181; H05K 3/4611;
(Continued)

(56) References Cited

U.S. PATENT DOCUMENTS 5,406,459 A * 4/1995 Tsukamoto ............ H05K 3/321
174/260
6,285,559 B1 * 9/2001 Fukiharu .............. H05K 1/0243
257/E23.114
(Continued)

FOREIGN PATENT DOCUMENTS

DE 102007046493 A1 4/2009
JP 56-106471 A 8/1981
(Continued)

OTHER PUBLICATIONS

International Search Report and Written Opinion of PCT Application No. PCT/JP2016/083476, dated Dec. 13, 2016, 11 pages of ISRWO.

*Primary Examiner* — Pete T Lee
(74) *Attorney, Agent, or Firm* — Chip Law Group

(57) ABSTRACT

The present disclosure relates to a substrate apparatus and a method of manufacturing a substrate apparatus capable of improving a manufacturing quality and reliability of the substrate apparatus as an electronic device. By laminating a plurality of sheet-like substrates on which a wiring pattern is formed, an individual substrate in which internal wiring is formed, and the individual substrate physically and electrically connects two substrates. The present disclosure is capable of being applied to the substrate apparatus.

8 Claims, 8 Drawing Sheets

(51) Int. Cl.
  *H05K 1/11* (2006.01)
  *H05K 1/18* (2006.01)
  *H05K 3/46* (2006.01)
  *H01L 23/00* (2006.01)

(52) U.S. Cl.
  CPC ............ *H05K 3/4611* (2013.01); *H01L 24/16* (2013.01); *H01L 24/97* (2013.01); *H01L 2224/16225* (2013.01); *H05K 2201/042* (2013.01); *H05K 2201/09009* (2013.01); *H05K 2201/10734* (2013.01)

(58) Field of Classification Search
  CPC ... H05K 2201/042; H05K 2201/09009; H05K 2201/10734; H01L 24/16; H01L 24/97; H01L 2224/16225
  See application file for complete search history.

(56) References Cited

U.S. PATENT DOCUMENTS

| | | |
|---|---|---|
| 7,005,584 B2 | 2/2006 | Levi et al. |
| 2005/0168961 A1* | 8/2005 | Ono .................... H01L 23/5385 361/784 |
| 2015/0223338 A1* | 8/2015 | Noda .................. H01L 23/5383 361/771 |

FOREIGN PATENT DOCUMENTS

| | | |
|---|---|---|
| JP | 56-106471 U | 8/1981 |
| JP | 08-195540 A | 7/1996 |
| JP | 2001-177235 A | 6/2001 |
| JP | 2005-005092 A | 1/2005 |
| JP | 2005-243863 A | 9/2005 |
| WO | 2009/043649 A2 | 4/2009 |

* cited by examiner

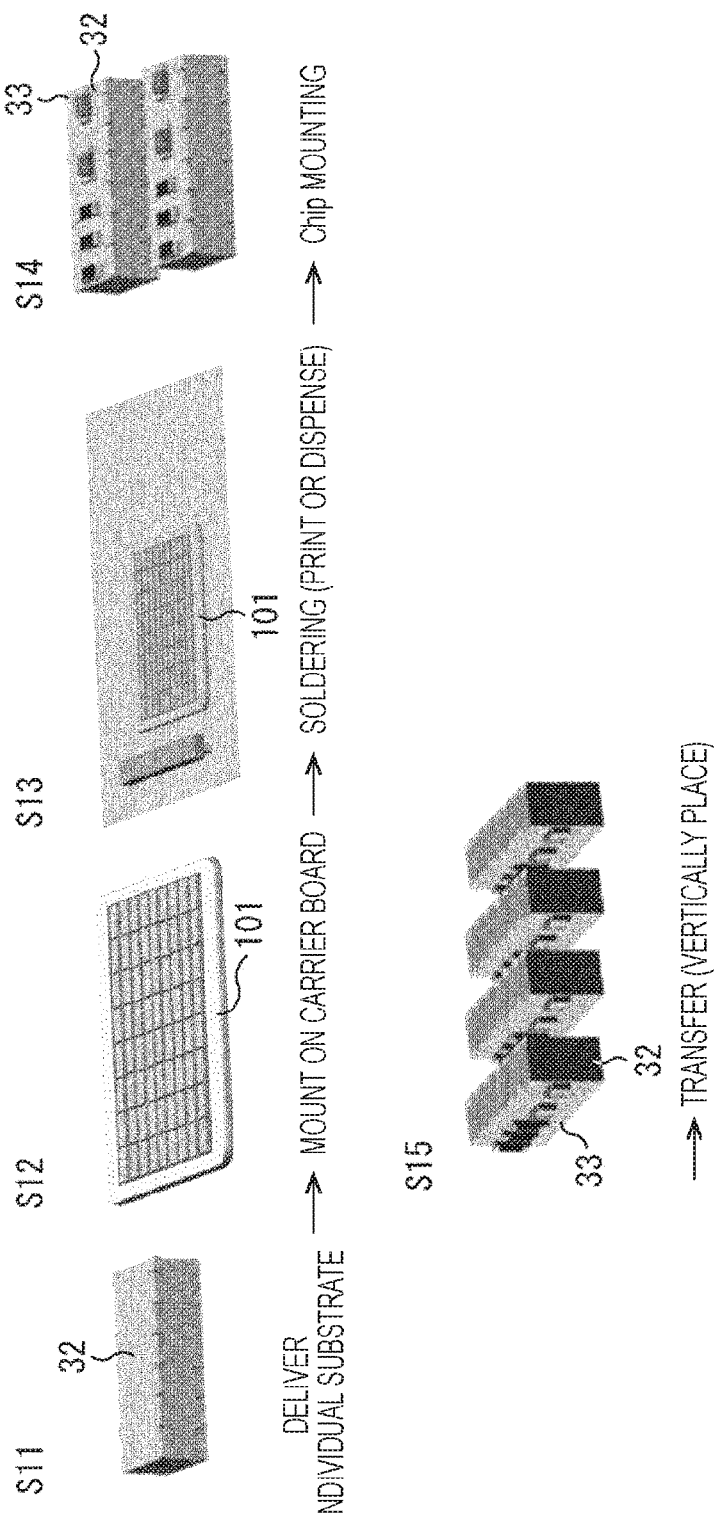

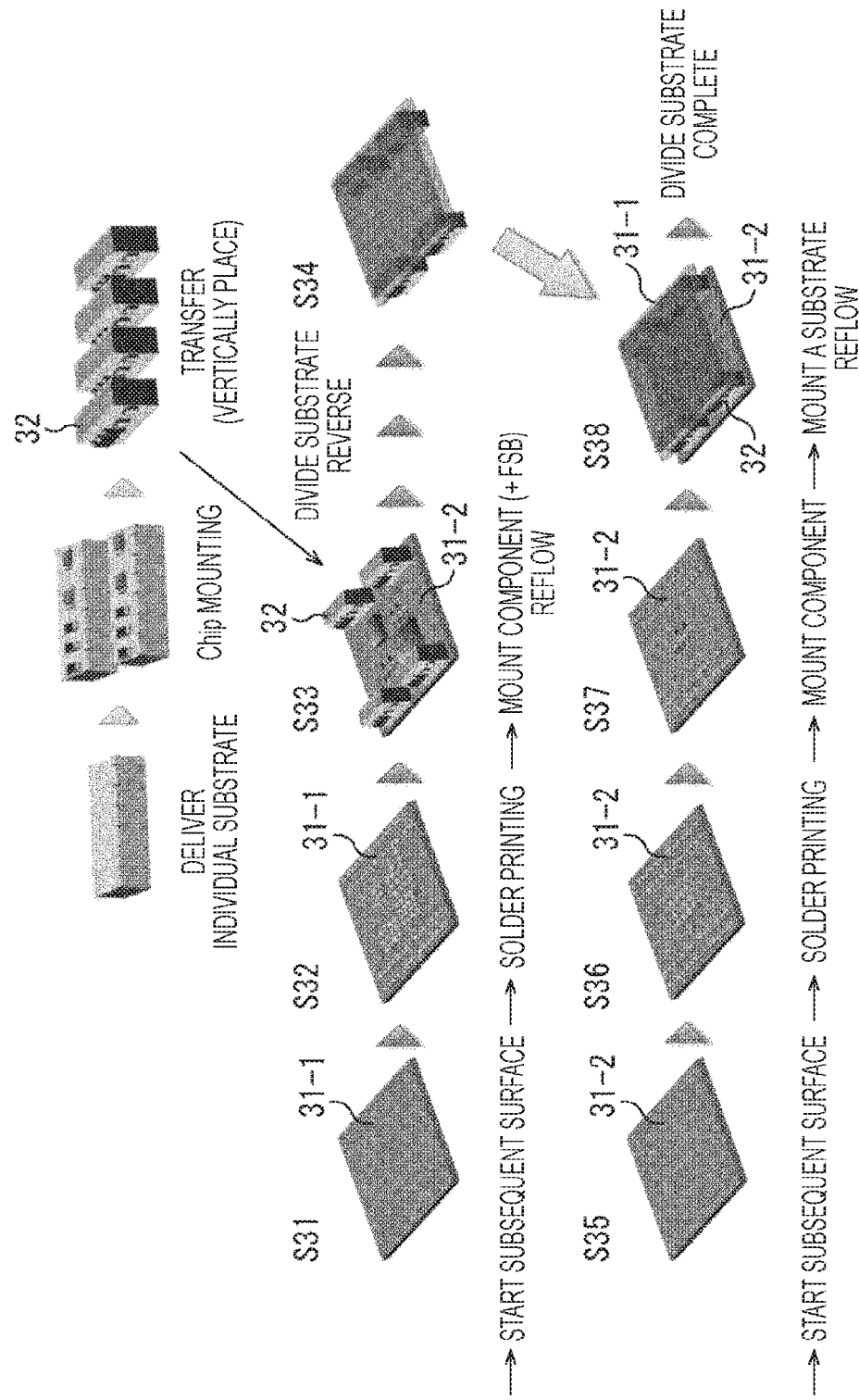

SUBSTRATE APPARATUS AND METHOD OF MANUFACTURING THE SAME

CROSS REFERENCE TO RELATED APPLICATIONS

This application is a U.S. National Phase of International Patent Application No. PCT/JP2016/083476 filed on Nov. 11, 2016, which claims priority benefit of Japanese Patent Application No. JP 2015-231326 filed in the Japan Patent Office on Nov. 27, 2015. Each of the above-referenced applications is hereby incorporated herein by reference in its entirety.

TECHNICAL FIELD

The present disclosure relates to a substrate apparatus and a method of manufacturing a substrate apparatus, and in particular, to a substrate apparatus and a method of manufacturing a substrate apparatus, which are capable of improving reliability regarding strength and an operation.

BACKGROUND ART

The technology for connecting a plurality of substrates to form a substrate apparatus has been widely used in general.

In a case where the plurality of substrates is connected, it is necessary to provide a large mounting area if a connector connects between the substrates. It is difficult to reduce the size of the apparatus in this case.

In view of this, a technology for singulating a normal substrate and connecting the divided substrates by a Land Grid Array (LGA) or a Ball Grid Array (BGA) has been proposed (refer to Patent Document 1).

However, in a case where the normal substrate is singulated and connected by the LGA or the BGA, if miniaturization is further proceeded, sufficient connection strength cannot be maintained. Since deterioration in reliability of strength of a connection portion is expected, it is necessary to take measures such as applying a reinforcing resin or the like.

Therefore, a technology for forming a side land on the normal substrate and mounting a component on the side land has been proposed (refer to Patent Document 2).

CITATION LIST

Patent Document

Patent Document 1: Japanese Patent Application Laid-Open No. 2001-177235
Patent Document 2: Japanese Patent Application Laid-Open No. 2005-243863

SUMMARY OF THE INVENTION

Problems to be Solved by the Invention

However, in the technology disclosed in Patent Document 2, a connection area cannot be sufficiently secured. That is, an exposed area of an electrode on an end surface of the substrate is very small, and deterioration in quality of manufacture and deterioration in reliability in an operation of a completed substrate apparatus may occur due to a burr and the like.

The present disclosure has been made in view of such circumstances. In particular, a purpose of the present disclosure is to improve manufacturing quality and reliability of an operation of a substrate apparatus.

Solutions to Problems

A substrate apparatus according to a first aspect of the present disclosure includes a substrate on which a component is mounted and an individual substrate which is electrically connected to the substrate and on which another component different from the component is mounted on a surface different from a surface connected to the substrate.

The individual substrate can electrically connect the substrate to another substrate different from the substrate.

The individual substrate can have a mounting surface, on which the component is mounted, in a direction different from a direction in which the substrate and the another substrate are laminated.

The individual substrate can have a rectangular shape, and an electrode in contact with surfaces along three directions can be formed at each corner, and the electrode can be connected to an electrode of the substrate with solder.

The individual substrate can be formed by laminating a plurality of sheet-like substrates in a direction different from a direction in which the substrate and the another substrate are laminated.

The individual substrate can be formed by laminating the plurality of sheet-like substrates in a direction perpendicular to the direction in which the substrate and the another substrate are laminated.

A wiring pattern can be formed on each of the plurality of sheet-like substrates, the plurality of sheet-like substrates is laminated in the direction perpendicular to the direction in which the substrate and the another substrate are laminated, and accordingly, an internal wiring is formed in the individual substrate by laminating the plurality of wiring patterns, and the direction of the internal wiring can be perpendicular to the direction of the wiring patterns each formed on the substrate and the another substrate.

A method of manufacturing a substrate apparatus including an individual substrate that is electrically connected to a substrate on which a component is mounted, has other component different from the component mounted on a surface different from the surface connected to the substrate, and electrically connects the substrate and the other component by an internal wiring, the method according to a first aspect of the present disclosure includes a first process of forming a wiring pattern on each of a plurality of sheet-like substrates and a second process of laminating the plurality of sheet-like substrates. By laminating the plurality of sheet-like substrates, an outer shape of the individual substrate is formed, and the plurality of sheet-like substrates on which the wiring pattern is formed is laminated, and accordingly, the internal wiring is formed in the individual substrate.

According to one aspect of the present disclosure, the individual substrate is electrically connected to the substrate on which the component is mounted, and another component different from the component is mounted on a surface different from the surface connected to the substrate.

A substrate apparatus according to a second aspect of the present disclosure includes a substrate on which a component is mounted and an individual substrate which is formed by laminating a plurality of sheet substrates and includes an external electrode formed on a front surface of at least one sheet substrate and a through electrode connected to the external electrode as passing through the at least one sheet substrate. The individual substrate is electrically connected on the substrate so that the external electrode of the individual substrate is provided in a direction different from the surface of the substrate.

At an end of the surface of the at least one sheet substrate, a substrate connection electrode to connect the sheet substrate to the substrate can be formed.

A wiring pattern is formed on the front surface of the at least one of the other sheet substrates of the plurality of sheet substrates, and the external electrode and the substrate connection electrode are connected to each other via the wiring pattern.

In the second aspect of the present disclosure, the component is mounted on the substrate, and the external electrode is formed by laminating the plurality of sheet substrates and is formed on the front surface of the at least one sheet substrate, and a through electrode passes through the at least one sheet substrate, and the individual substrate is electrically connected on the substrate so that the external electrode of the individual substrate connected to the external electrode is provided in a direction different from the surface of the substrate.

Effects of the Invention

According to a first and second aspects of the present disclosure, it is possible to improve quality of a substrate apparatus as an electronic component and reliability of an operation of the substrate apparatus in both aspects.

BRIEF DESCRIPTION OF DRAWINGS

FIG. 8 is a view to describe mounting components attaching processing for mounting components on a mounting surface of the individual substrate.

FIG. 9 is a view to describe a method of manufacturing a substrate apparatus by using the substrate and the individual substrate.

MODE FOR CARRYING OUT THE INVENTION

<Side View and Top View of Substrate Apparatus According to Present Disclosure>

Figure 1:
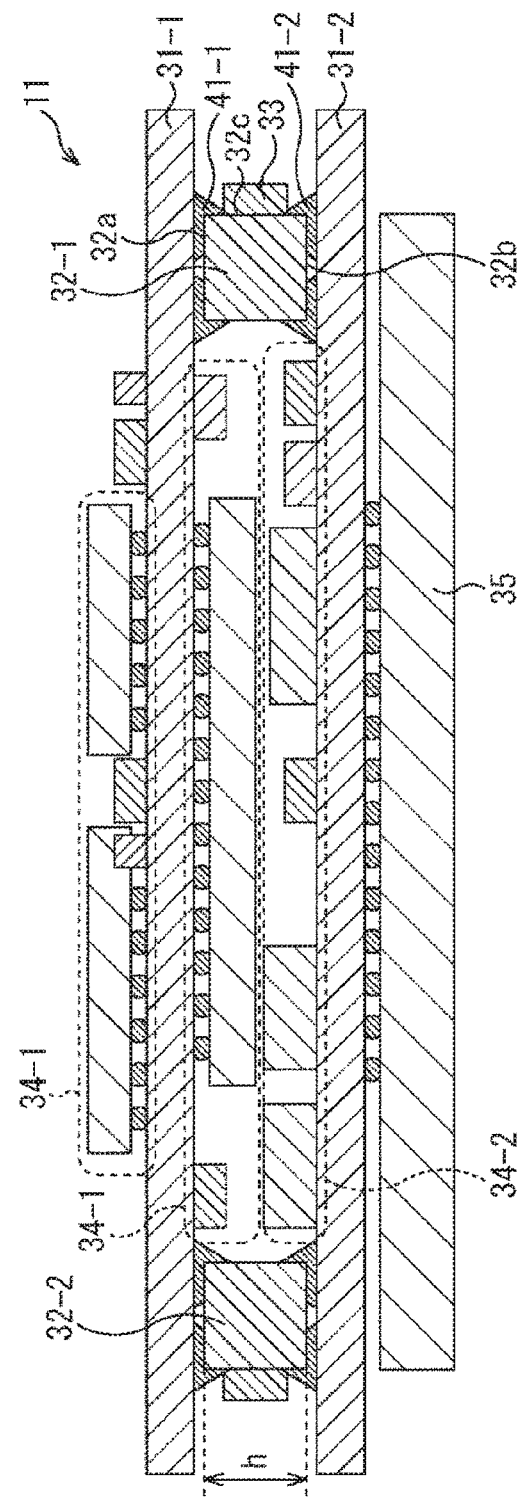
FIG. 1 is a side view of an exemplary configuration of an embodiment of a substrate apparatus to which the present disclosure has been applied.
Figure 2:
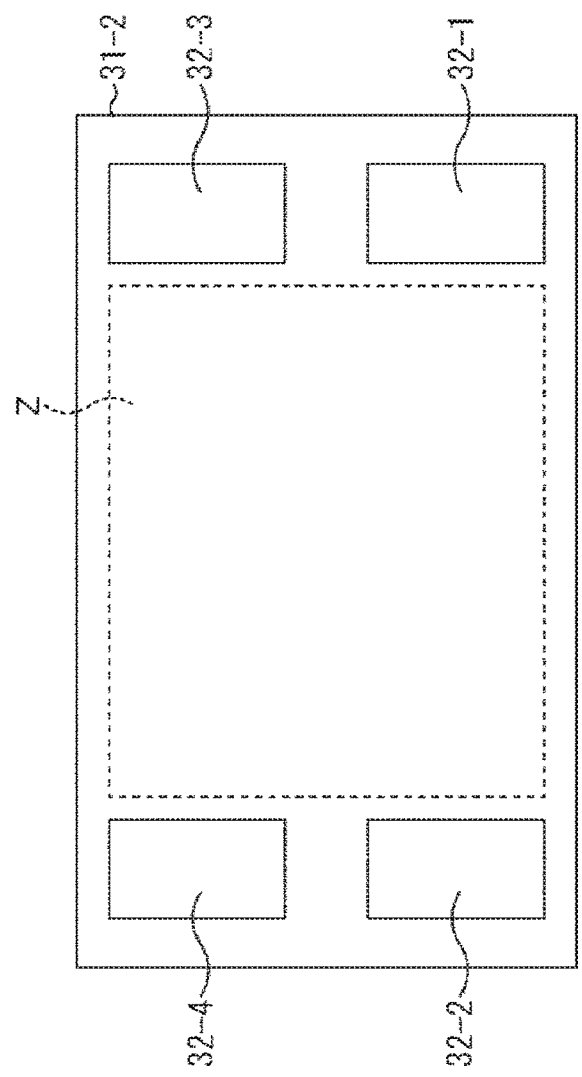
FIG. 2 is a top view of an exemplary configuration of the substrate apparatus in FIG. 1.

FIGS. 1 and 2 are a side view and a top view of an exemplary configuration of an embodiment of a substrate apparatus to which a technology of the present disclosure has been applied.

As illustrated in FIG. 1, a substrate apparatus 11 according to the present disclosure includes substrates 31-1 and 31-2 provided on an upper and a lower sides and individual substrates 32-1 and 32-2 which physically and electrically connect the substrates 31-1 and 31-2.

Note that, in the present embodiment, a relatively large component 35 is mounted on the surface of the substrate 32-2 on the side opposite to the side to which the individual substrates are connected.

A portion corresponding to the component 35 may be, for example, a base substrate on which the substrate apparatus 11 is mounted.

Note that, in a case where it is not necessary to especially distinguish the substrates 31-1 and 31-2 and the individual substrates 32-1 and 32-2 from each other, the substrates are simply referred to as a substrate 31, and the individual substrates are simply referred to as an individual substrate 32. This is similarly applied to the other components.

On the substrate 31-1, mounting components 34-1 are mounted on a front surface and a back surface which are respectively an upper surface and a lower surface in FIG. 1. Furthermore, mounting components 34-2 are mounted on an upper surface of the substrate 31-2 in FIG. 1, and a lower surface is connected to the base substrate 35.

The substrates 31-1 and 31-2 are physically and electrically connected to each other along the vertical direction in FIG. 1 by the individual substrates 32-1 and 32-2 provided on the left and right in FIG. 1.

More specifically, an upper surface 32a of the individual substrate 32, on the upper side in FIG. 1, is connected to a mounting land 31a of the substrate 31-1 (FIG. 5) with solder 41-1, and a lower surface 32b in FIG. 1 is connected to a mounting land 31a of the substrate 31-2 (FIG. 5) with solder 41-2.

With such a configuration, since the substrates 31-1 and 31-2 are bonded together via the individual substrates 32-1 and 32-2, an area of a surface to be connected by solder can be widely provided. As a result, the substrates 31-1 and 31-2 can be more firmly connected to each other.

In addition, in the individual substrate 32-1 on the right side in FIG. 1, a mounting surface 32c is provided on the right side in FIG. 1, and a mounting component 33 is physically and electrically connected to the mounting surface 32c with solder.

With such a configuration, as described above, while the area of the connection surface of the individual substrate 32 necessary for being more firmly connected to the substrates 31-1 and 31-2 is increased, the mounting component 33 can be connected to the side different from those of the substrates 31-1 and 31-2 by providing the mounting surface 32c on the side different from the connection directions of the substrates 31-1 and 31-2. Therefore, a space efficiency in mounting the component can be improved. In addition, the mounting component 33 formed on the mounting surface 32c can be mounted on the side different from sides where the substrates 31-1 and 31-2 are formed. Therefore, for example, after the substrates 31-1 and 31-2 and the individual substrate 32 are connected to each other, a new mounting component 33 can be additionally connected to the mounting surface 32c.

A height h of the individual substrate 32 in the vertical direction in FIG. 1 is a distance between the surfaces of the substrates 31-1 and 31-2 facing to each other. With the height h, portions where the mounting components 34-1 and 34-2 do not have contact with each other. Therefore, the height h may be changed as necessary.

Furthermore, as illustrated in FIG. 2, the individual substrates 32-1 to 32-4 are provided on both ends on the left and the right in FIG. 2 so as to surround a region Z on the substrate 31-1 where the mounting component 34-1 is mounted. Note that, although not shown, the substrate 31-2 is connected to cover the individual substrates from the front side of the paper sheet in FIG. 2.

Furthermore, the portion on the substrate 31 where the individual substrate 32 is provided may be any region other than the region Z where the mounting component 34-1 is mounted, and the layout is not limited to that in FIG. 2. In addition, if the portion where the individual substrate 32 is provided is other than the region Z where the mounting component 34-1 is mounted, it is possible to cope with various layouts by changing the size and the shape of the individual substrate 32.

<Exemplary Configuration of Individual Substrate>

Next, a detailed configuration of the individual substrate 32 will be described with reference to a perspective overview in FIG. 3.

Figure 3:
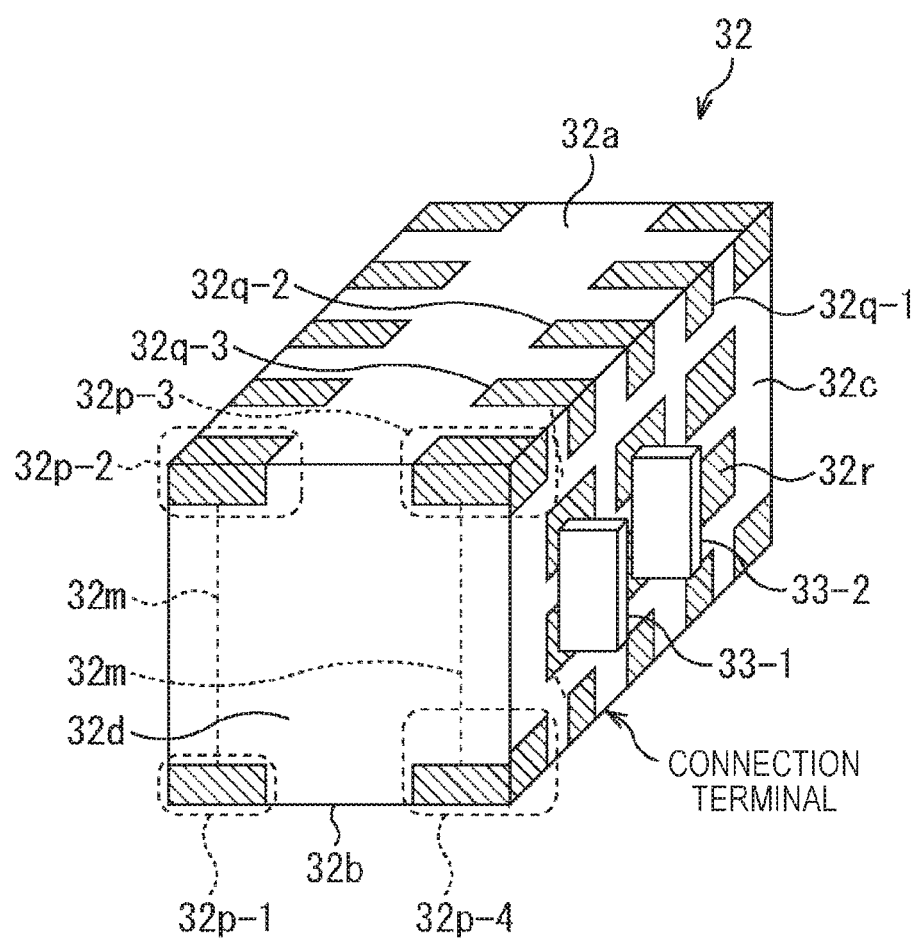
FIG. 3 is a perspective overview to describe a configuration of an individual substrate.

As illustrated in FIG. 3, the individual substrate 32 has a rectangular shape. Note that an upper surface in FIG. 3 is the upper surface 32a to be connected to the substrate 31-1, and a lower surface which is not shown is the lower surface 32b to be connected to the substrate 31-2. Furthermore, a surface on the right side in FIG. 3 is the mounting surface 32c, and the mounting components 33-1 and 33-2 are connected to the mounting surface 32c in FIG. 3.

At corners (corner portion), surrounded by dotted lines, where the upper surface 32a, the mounting surface 32c, and a side surface 32d (side surface on front side in FIG. 3) are connected and where the lower surface 32b, the mounting surface 32c, and the side surface 32d (side surface on front side in FIG. 3) are connected, electrodes 32p (for example, electrodes 32p-1 to 32p-4 and the like) which can electrically connect three surfaces are provided. Note that, although not indicated by the dotted lines, naturally, four electrodes 32p similar to the electrodes 32p-1 to 32p-4 exist on the back surface side in FIG. 3.

In addition, at the corner between the upper surface 32a and the mounting surface 32c and the corner between the lower surface 32b and the mounting surface 32c, electrodes 32q (for example, 32q-1 to 32q-3 and the like) which can electrically connect two surfaces are provided. Note that, although a reference number is not applied to the electrode 32q, naturally, three electrodes 32q corresponding to the electrodes 32q-1 to 32q-3 exist at all corners between the upper surface 32a and the mounting surface 32c and between the lower surface 32b and the mounting surface 32c.

In addition, in the individual substrate 32, internal wirings 32m, indicated by dotted lines, are provided which are respectively and electrically connected to the electrodes 32p, 32q, and the like as necessary in FIG. 3. The internal wirings 32m are electrically connected to the electrodes 32p, 32q, and 32r, and the like as necessary so that the substrates 31-1 and 31-2 are electrically connected to each other.

Figure 4:
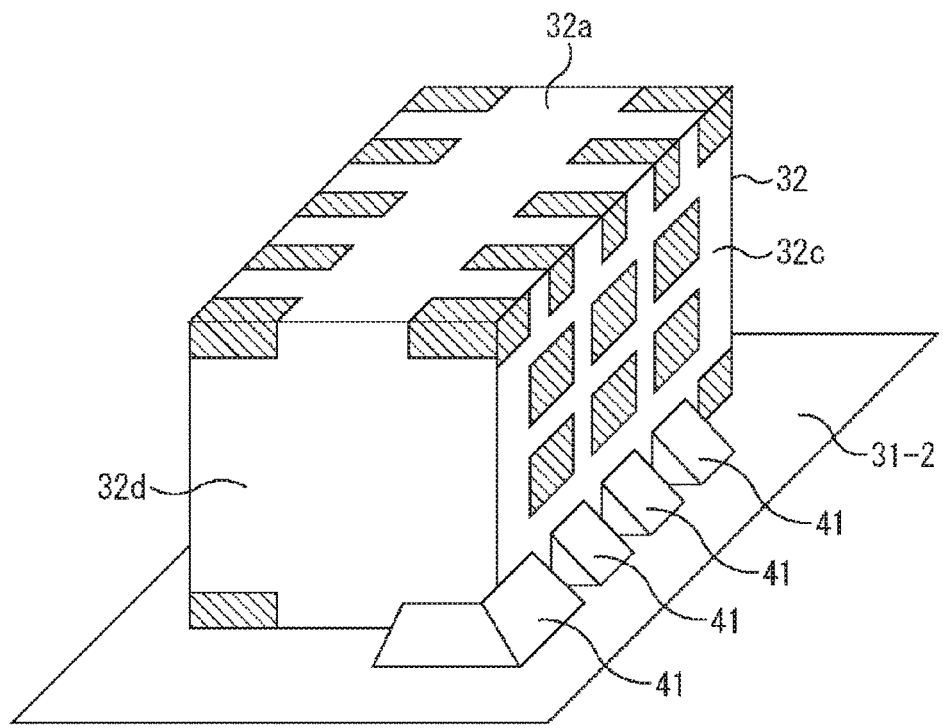
FIG. 4 is a view to describe exemplary connection between the individual substrate in FIG. 3 and a substrate with solder.

Since the individual substrate 32 can be electrically connected to a plurality of surfaces with solder and the like by the electrodes 32p and 32q, for example, the individual substrate 32 can be connected to the substrate 31-2 with the solder 41 as illustrated in FIG. 4. Therefore, since the area where the substrate 31-2 and the individual substrate 32 are connected with the solder can be widely provided, the substrate 31-2 and the individual substrate 32 can be physically, electrically, and firmly connected.

Figure 5:
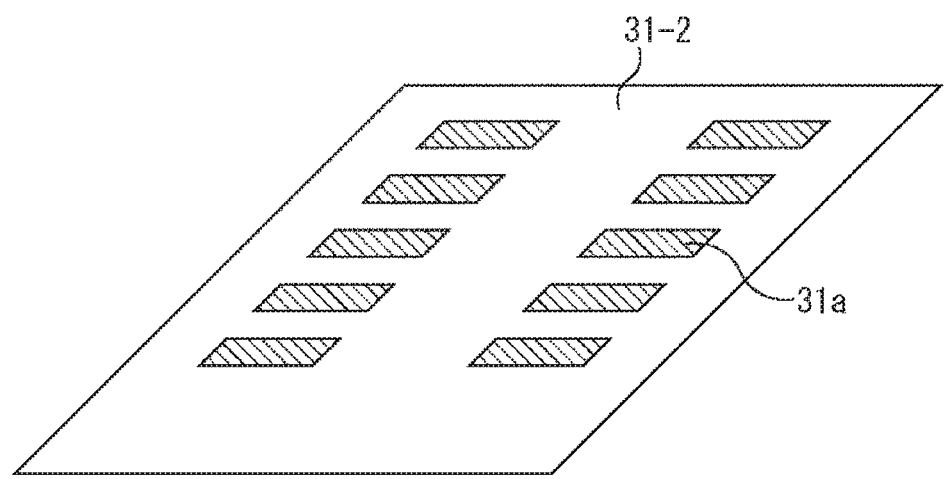
FIG. 5 is a view to describe an exemplary arrangement of mounting lands provided on the substrate in FIG. 4.

On the substrate 31-2, as illustrated in FIG. 5, the mounting lands 31a to be connection electrodes are provided at positions facing to the electrodes 32p and 32q of the individual substrate 32.

As a result, the substrates 31-1 and 31-2 can be physically, electrically, and firmly connected to each other with high accuracy. Therefore, since physical misalignment and electrical disconnection can be prevented, reliability as a function of the substrate apparatus 11 can be improved.

In addition, on the mounting surface 32c of the individual substrate 32, the electrodes 32r which can be connected to the mounting components 33-1 and 33-2 in the direction perpendicular to the direction where the substrates 31-1 and 31-2 and the like are formed. In FIG. 3, the six electrodes 32r are illustrated in total.

With such a configuration, the mounting components 33-1 and 33-2 can be connected in the direction perpendicular to the direction of the substrates 31-1 and 31-2 where the mounting component 34-1 and 34-2 are formed. As a result, even in a state where the mounting components 33-1 and 33-2 cannot be disposed on the substrates 31-1 and 31-2, the mounting components 33-1 and 33-2 can be mounted. Therefore, a space efficiency of the entire substrate apparatus 11 can be improved. Furthermore, the mounting components 33-1 and 33-2 can be additionally and easily provided after the individual substrate 32 and the substrates 31-1 and 31-2 have been connected to each other.

Note that the number of electrodes 32p, 32q, and 32r illustrated in FIG. 3 is merely an example, and the number other than the above may be used.

<Method of Manufacturing Individual Substrate>

Next, a method of manufacturing the individual substrate 32 will be described with reference to FIG. 6.

In step S1, the individual substrate 32 has a structure in which ceramic green sheets 51 which are sheet-like substrates are laminated. Therefore, the green sheet 51 is prepared, and via holes 51a used to form the electrodes are formed.

In step S2, conductive paste 62 is spread by a squeegee 61 and is filled into the via holes 51a in the green sheet 51.

In step S3, a wiring pattern is printed on the green sheet 51 by using a printing screen 71. The green sheets 51 are laminated by processing as described later. However, since a wiring pattern is different according to the position of the green sheet 51 in the laminate, the wiring pattern to be printed on the green sheet 51 is different according to the position of the green sheet in the laminate.

In step S4, the plurality of green sheets 51 with printed wiring pattern is laminated. In FIG. 6, for example, an example is illustrated in which ten green sheets 51 are laminated. The green sheets are counted from the upper side in FIG. 6 as a first to tenth layers, and the respective laminated green sheets 51-1 to 51-10 are illustrated in FIG. 6. Furthermore, the number of laminated sheets is ten in the example in FIG. 6. However, the number of sheets may be other than ten.

In step S5, the ten laminated green sheets 51-1 to 51-10 are diced by a dicing blade 81, and the shape of the individual substrate 32 is formed.

In step S6, by applying plating such as gold plating on exterior portions of wirings and the like of each individual substrate 32, the individual substrate 32 is completed.

Figure 7:
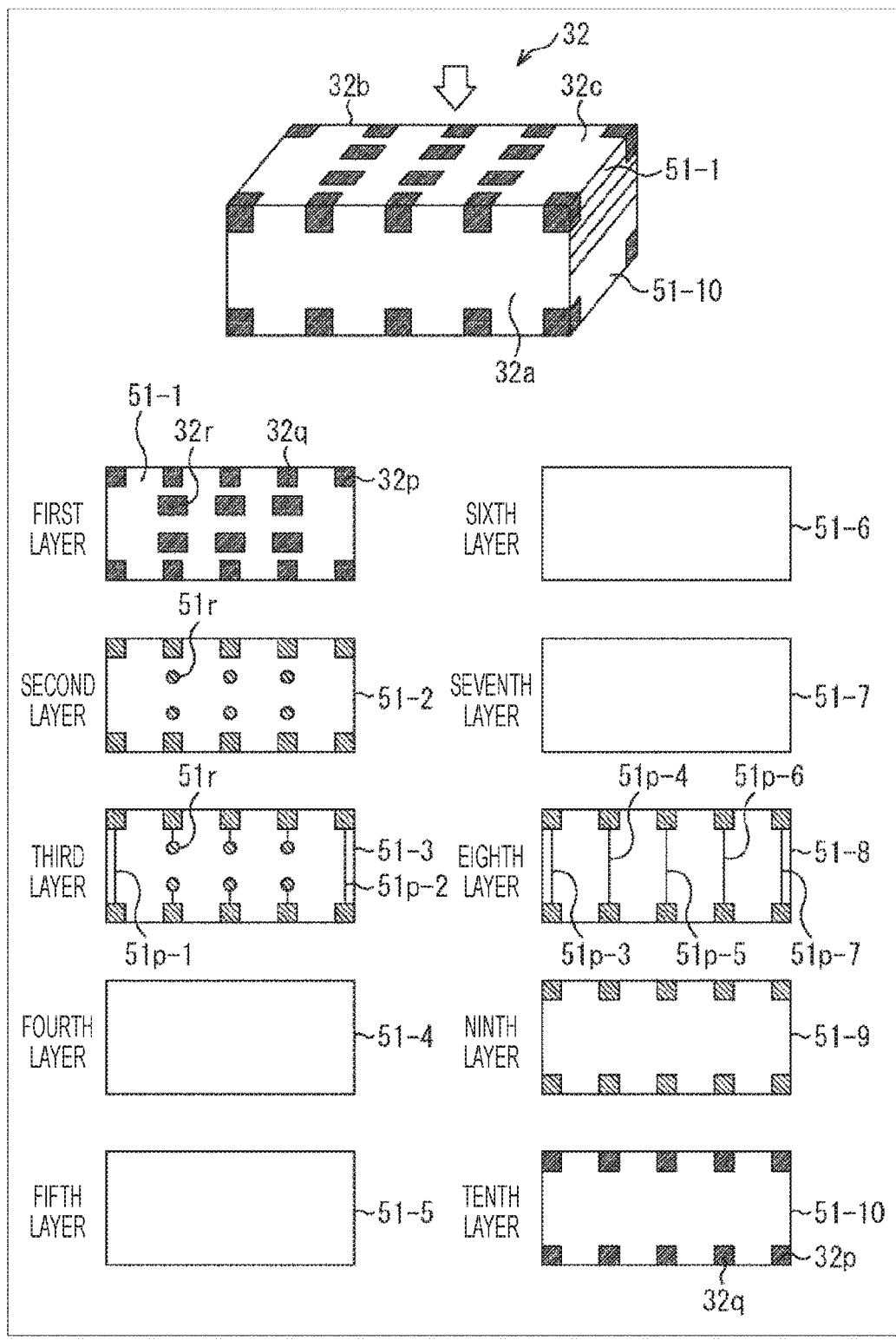
FIG. 7 is a diagram to describe electrode configurations of layers, including green sheets, included in the individual substrate in FIG. 6.

The individual substrate 32 completed in this way is illustrated in the upper portion in FIG. 7. In the individual substrate 32 illustrated in the upper portion in FIG. 7, the upper surface in FIG. 7 is the mounting surface 32c, a surface on the front side of the paper sheet is the upper surface 32a, and a surface on the depth side of the paper sheet which is not shown is the lower surface 32b. The green sheets 51-1 to 51-10 are laminated in the direction indicated by an arrow in the upper portion in FIG. 7.

At this time, the wiring patterns formed on the respective green sheets 51-1 to 51-10 are, for example, illustrated in the lower portion in FIG. 7.

In the first to third green sheets 51-1 to 51-3 in the lower portion in FIG. 7, respectively, the electrodes 32p and 32q and wiring patterns 51p-1 and 51p-2 to be connected to the electrodes 32p and 32q, and the electrode 32r to be formed on the mounting surface 32c and a wiring pattern 51r to be connected to the electrode 32r are provided.

Furthermore, on the fourth to seventh green sheets 51-4 to 51-7, wiring patterns are not formed, and the green sheets 51-4 to 51-7 have electrically insulated structures.

In addition, on the eighth to tenth green sheets 51-8 to 51-10, wiring patterns 51p-3 to 51p-7 to be connected to the electrodes 32p and 32q are respectively provided.

That is, the wiring patterns 51p and 51r formed on the green sheets 51 which are sheet-like substrates and the wiring patterns formed on the substrates 31-1 and 31-2 are formed in different directions.

These electrodes 32p, 32q, and 32r are connected to the pattern, including the conductive paste, printed on the surface of the third green sheet 51-3, for example, via the conductive paste filled into the via holes in the second green sheet 51-2.

This path corresponds to the internal wiring 32m described in FIG. 3.

Figure 6:
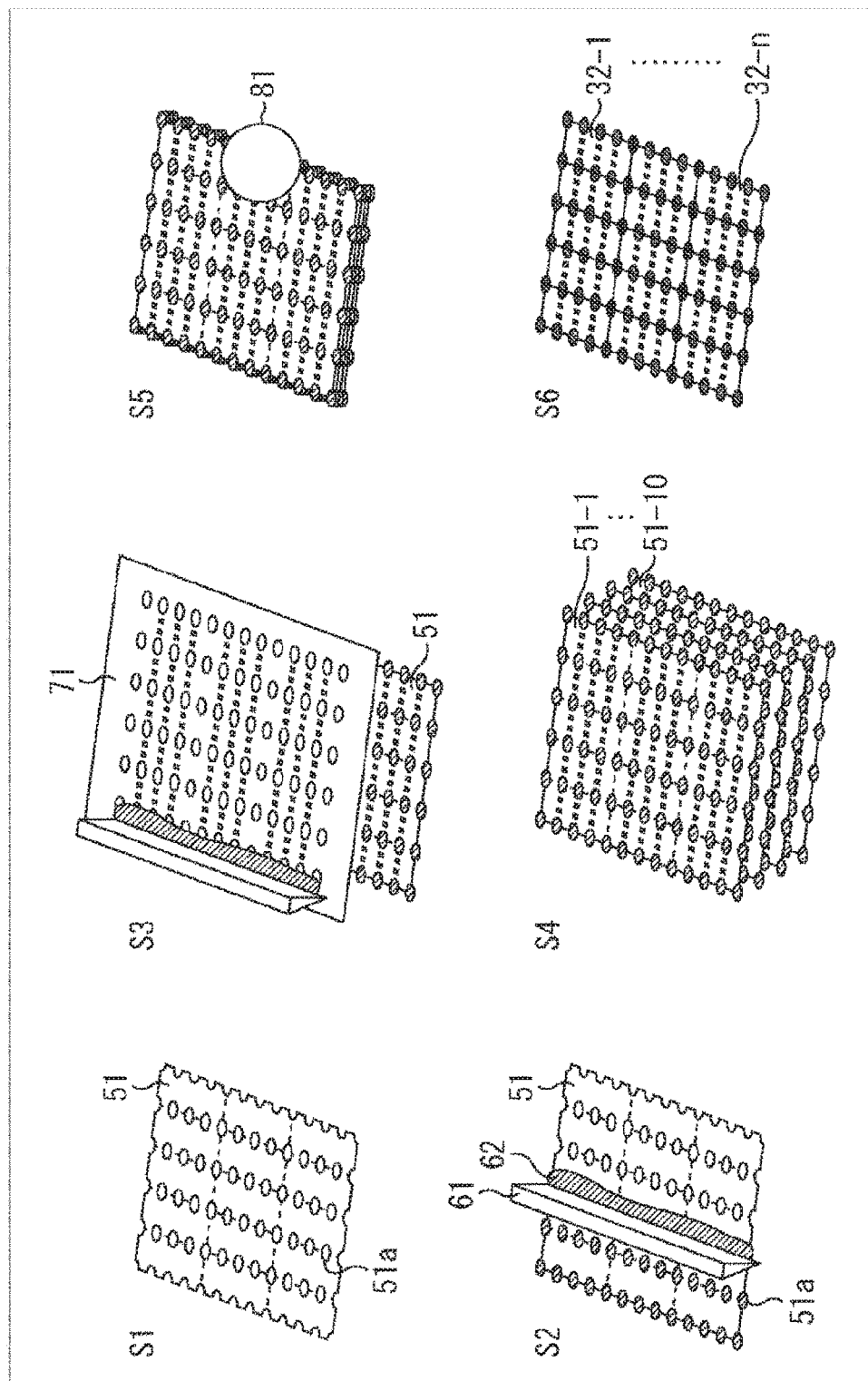
FIG. 6 is a view to describe a method of manufacturing the individual substrate in FIG. 3.

Note that the electrodes 32p, 32q, and 32r in the first green sheet 51-1 in FIG. 7 indicate portions to which gold plating and the like are applied in step S6 in FIG. 6. Each electrode has a double-layer structure including the conductive paste filled into the via holes formed in the green sheet and a gold plating layer.

Furthermore, a portion indicated by 51r and the like in the second green sheet 51-2 indicates a state where the conductive paste is filled into the via holes provided in the green sheet in step 2 in FIG. 6.

In addition, the third green sheet 53-3 indicates a state where pattern printing is performed by the conductive paste in step S3 after the conductive paste has been filled in step S2 in FIG. 6.

For example, portions illustrated as 51p-1, 51p-2, and 51r in the third layer are the conductive paste printed on the surface of the green sheet 51-3, and the electrode portion (portion corresponding to 32q in the first layer) has a double-layer structure including the conductive paste filled into the via holes formed in the green sheet 51-3 and the conductive paste formed by printing.

With such a configuration, the electrode 32p is formed as an electrode having a shape in contact with surfaces along three directions at the corners of the rectangular individual substrate 32 (corner portion). As a result, as described with reference to FIG. 4, the three surfaces in total can be connected via the solder 41. The three surfaces include the surface in contact with the sides facing to the substrates 31-1 and 31-2 and two surfaces substantially perpendicular to the above surface. With this configuration, the individual substrate 32 and the substrates 31-1 and 31-2 can be firmly connected to each other, and the substrate apparatus 11 can have a firm configuration.

As a result, physical disconnection between the individual substrate 32 and the substrates 31-1 and 31-2 can be prevented. Therefore, an electrical non-contact state in the substrate apparatus 11 can be prevented, and manufacturing quality as an electronic device and reliability can be improved.

Furthermore, the electrode 32q can be connected to two surfaces, i.e., the surface facing to the substrates 31-1 and 31-2 and the surface perpendicular to the above surface via the solder 41. Therefore, together with the electrode 32p, the electrode 32q contributes to firmly connect the individual substrate 32 and the substrates 31-1 and 31-2. As a result, the manufacturing quality as an electronic device and the reliability of the substrate apparatus 11 can be improved.

<Method of Mounting on Individual Substrate>

Next, a method of mounting the mounting component 33 on the individual substrate 32 will be described with reference to FIG. 8.

In step S11, the plurality of individual substrates 32 manufactured by the described method of manufacturing the individual substrate 32 is obtained.

In step S12, the plurality of individual substrates 32 is arranged on a carrier board 101 so that the mounting surface 32c is positioned as the upper surface in FIG. 8.

In step S13, as illustrated in FIG. 8, printing, dispensing, or the like is performed to apply the solder to physically and electrically connect the respective mounting components 33 to the plurality of electrodes 32r on the mounting surfaces 32c of the individual substrates 32 on the carrier board 101.

In step S14, the mounting component 33 is connected to a portion on which the solder is applied on the mounting surface 32c.

In step S15, the individual substrate 32 is placed in the different direction so that the mounting surface 32c on which the mounting component 33 is connected and mounted is the side surface. With this placement, a mounter can easily pick up the mounting component 33 in a subsequent mounting process.

<Method of Manufacturing Substrate Apparatus Including Individual Substrate>

Next, a method of manufacturing the substrate apparatus 11 including the individual substrate 32 will be described with reference to FIG. 9.

The description will start from an upper left portion in FIG. 9. In step S31, the substrate 31-1 is formed as facing the lower surface in FIG. 1 upward.

In step S32, the solder to connect the mounting component 34-1, the individual substrate 32, and the like to the lower surface of the substrate 31-1 in FIG. 1 is coated by the printing according to the arrangement of the electrodes and the like.

In step S33, the mounting component 34-1 and the individual substrate 32 mounted on the substrate 31-1 are connected with the solder.

In step S34, the upper surface and the lower surface of the substrate 31-1 on which the mounting component 34 and the individual substrate 32 are mounted are reversed.

In step S35, the upper surface of the substrate 31-2 in FIG. 1 is faced upward.

In step S36, the solder to connect the mounting component 34-2, the individual substrate 32, and the like to the upper surface of the substrate 31-2 in FIG. 1 is coated by the printing according to the arrangement of the electrodes and the like.

In step S37, the mounting component 34-2 to be mounted on the substrate 31-2 is connected with the solder.

In step S38, the substrate 31-1 on which the mounting component 34-1 and the individual substrate 32 are mounted is connected to the substrate 31-2 with the solder.

According to the series of processing, the substrate apparatus 11 is completed.

Note that, in the above processing, the processing in steps S31 to S34 and the processing in steps S35 to S37 may be performed in parallel, and the substrates may be connected in step S38.

Furthermore, in the above, an example in which the substrates 31-1 and 31-2 are connected by the individual substrate 32 has been described. However, the substrate apparatus 11 may be formed by connecting the individual substrate 32 by using one of the substrates 31-1 and 31-2. In this case, the single substrate 31 is used. However, even in a case where there is a mounting component 34 which cannot be arranged on the single substrate 31, the mounting component 34 can be mounted on the mounting surface 32c of the individual substrate 32.

Furthermore, much more, for example, equal to or more than three substrates 31 may be laminated, and the layers may be physically and electrically connected by using an additional individual substrate 32.

As a result, when the substrate apparatus 11 is formed, the space efficiency required for the layout of the mounting components 33 can be improved.

Furthermore, each step described with reference to the above-mentioned flowchart can be performed by the single device and can be divided and performed by the plurality of devices.

In addition, in a case where a plurality of processing is included in a single step, the plurality of processing included in the single step can be performed by the single device and can be divided and performed by the plurality of devices.

Furthermore, an example in which the electronic component is mounted on the mounting surface 32c of the individual substrate 32 has been described. However, the mounting surface 32c can be used as a test terminal without mounting the electronic component on the mounting surface 32c.

An example in which the electrodes 32r are arranged in two lines has been described in the present embodiment. However, in a case of being used as test terminals, the electrodes 32r may be arranged in a single line.

Note that, the present disclosure may have a configuration below.

<1> A substrate apparatus including:

a substrate on which a component is mounted; and an individual substrate that is electrically connected to the substrate and on which another component different from the component is mounted on a surface different from a surface connected to the substrate.

<2> The substrate apparatus according to <1>, in which the individual substrate electrically connects the substrate to another substrate different from the substrate.

<3> The substrate apparatus according to <1> or <2>, in which the individual substrate has a mounting surface, on which the component is mounted, in a direction different from a direction in which the substrate and the another substrate are laminated.

<4> The substrate apparatus according to any one of <1> to <3>, in which the individual substrate has a rectangular shape, and an electrode in contact with surfaces along three directions is formed at each corner, and the electrode is connected to an electrode of the substrate with solder.

<5> The substrate apparatus according to <2>, in which the individual substrate is formed by laminating a plurality of sheet-like substrates in a direction different from a direction in which the substrate and the another substrate are laminated.

<6> The substrate apparatus according to <5>, in which the individual substrate is formed by laminating a plurality of sheet-like substrates in a direction perpendicular to the direction in which the substrate and the another substrate are laminated.

<7> The substrate apparatus according to <5>, in which a wiring pattern is formed on each of the plurality of sheet-like substrates, the plurality of sheet-like substrates is laminated in a direction perpendicular to the direction in which the substrate and the another substrate are laminated, and accordingly, an internal wiring is formed in the individual substrate by laminating the plurality of wiring patterns, and the direction of the internal wiring is perpendicular to the direction of the wiring patterns each formed on the substrate and the another substrate.

<8> A method of manufacturing a substrate apparatus including an individual substrate that is electrically connected to a substrate on which a component is mounted, has another component different from the component mounted on a surface different from the surface connected to the substrate, and electrically connects the substrate and the another component by an internal wiring, the method including:

a first process of forming a wiring pattern on each of a plurality of sheet-like substrates; and a second process of laminating the plurality of sheet-like substrates, in which by laminating the plurality of sheet-like substrates, an outer shape of the individual substrate is formed, and by laminating the plurality of sheet-like substrates on which the wiring pattern is formed, the internal wiring is formed in the individual substrate.

<9> A substrate apparatus including:

a substrate on which a component is mounted; and an individual substrate that is formed by laminating a plurality of sheet substrates and includes an external electrode formed on a front surface of at least one sheet substrate and a through electrode connected to the external electrode as passing through the at least one sheet substrate; in which the individual substrate is electrically connected on the substrate so that the external electrode of the individual substrate is provided in a direction different from the surface of the substrate.

<10> The substrate apparatus according to <9>, in which at an end of the front surface of the at least one sheet substrate, a substrate connection electrode to connect the sheet substrate to the substrate is formed.

<11> The substrate apparatus according to <10>, in which a wiring pattern is formed on the front surface of the at least one other sheet substrate of the plurality of sheet substrates, and the external electrode and the substrate connection electrode are connected to each other via the wiring pattern.

REFERENCE SIGNS LIST 11 substrate apparatus
31, 31-1, 31-2 substrate
32, 32-1, 32-2 individual substrate
32a upper surface
32b lower surface
32c mounting surface
32p, 32p-1 to 32p-4, 32q, 32q-1 to 32q-3, 32r electrode
32m internal wiring
33, 34, 34-1, 34-2, 35 mounting component
41, 41-1, 41-2 solder
51, 51-1 to 51-10 green sheet

The invention claimed is:

1. A substrate apparatus, comprising:
a first substrate on which a first component is mountable; and
an individual substrate configured to electrically connect to the first substrate through a first surface of the individual substrate, wherein
a second component is mountable on a second surface of the individual substrate,
the first surface of the individual substrate is different from the second surface of the individual substrate,
the first component is different from the second component,
the individual substrate includes a first electrode at a corner of the individual substrate,
the first electrode is in contact with three surfaces of the individual substrate, and
the three surfaces of the individual substrate are connected at the corner.

2. The substrate apparatus according to claim 1, wherein
the individual substrate is further configured to electrically connect the first substrate to a second substrate,
the second substrate is in contact with a third surface of the individual substrate, and
the first substrate is different from the second substrate.

3. The substrate apparatus according to claim 2, wherein the second surface of the individual substrate is perpendicular to the first surface and the third surface.

4. The substrate apparatus according to claim 1, wherein
the individual substrate has a rectangular shape,
each corner of the individual substrate includes a respective electrode of a plurality of electrodes,
the plurality of electrodes includes the first electrode, and
the first electrode is connected to a second electrode of the first substrate with solder.

5. The substrate apparatus according to claim 2, wherein
the individual substrate comprises a plurality of sheet-like substrates, and
the plurality of sheet-like substrates is laminated in the individual substrate in a direction different from a direction of each of the first surface and the third surface.

6. The substrate apparatus according to claim 5, wherein the plurality of sheet-like substrates is laminated perpendicularly to each of the first surface and the third surface.

7. The substrate apparatus according to claim 5, wherein
each sheet-like substrate of the plurality of sheet-like substrates includes a respective wiring pattern of a first plurality of wiring patterns,
the plurality of sheet-like substrates is laminated perpendicularly to each of the first surface and the third surface,
the individual substrate includes an internal wiring,
the internal wiring includes the first plurality of wiring patterns,
the internal wiring in the individual substrate is perpendicular to a second plurality of wiring patterns, and
each of the first substrate and the second substrate includes the second plurality of wiring patterns.

8. A substrate apparatus, comprising:
a substrate on which a component is mountable; and
an individual substrate including:
a plurality of sheet-like substrates;
an external electrode on a front surface of a first sheet-like substrate of the plurality of sheet-like substrates;
a substrate connection electrode at a corner of the front surface of the first sheet-like substrate, wherein
the first sheet-like substrate is on a first surface of the individual substrate,
the individual substrate is configured to electrically connect to the substrate through a second surface of the individual substrate,
the first surface of the individual substrate is perpendicular to the second surface of the individual substrate,
the substrate connection electrode is configured to connect the first sheet-like substrate to the substrate; and
a wiring pattern on a front surface of a second sheet-like substrate of the plurality of sheet-like substrates, wherein
the external electrode is connected to the substrate connection electrode via the wiring pattern.

* * * * *